PRE-SET FINE TUNING

Filed Feb. 10, 1961 2 Sheets-Sheet 1

INVENTORS.
Reuben C. Carlson
Joseph N. Marchese
BY James T. Baer
ATTY.

INVENTORS.
Reuben C. Carlson
Joseph N. Marchese
BY
James T. Bank
ATTY.

3,192,494
Patented June 29, 1965

1

3,192,494

PRE-SET FINE TUNING

Reuben C. Carlson, Bensenville, and Joseph N. Marchese, Norridge, Ill., assignors to Admiral Corporation, Chicago, Ill., a corporation of Delaware Filed Feb. 10, 1961, Ser. No. 88,502
2 Claims. (Cl. 334—29)

This invention relates to a pre-set fine tuning arrangement for a television receiver or the like, and further to a combined fine tuning and channel selector programming device for a television receiver.

In the past, fine tuning for optimum reception of sound and picture on each of the several television frequency channels generally has required manual adjustment by the viewer each time he tuned to a different channel. With the advent of automatic channel selection and remote control tuning devices, it has become increasingly more desirable to eliminate the necessity of repeated fine tuning adjustments. The few pre-set fine tuning arrangements that have been designed to satisfy this need have added considerably to the cost and complexity of the receivers in which they are employed. They involve a plurality of individually adjustable knobs on the front of the receiver, costly mechanical apparatus serving as a fine tuning memory within the set, or both.

In addition, since in any given reception area only a fraction of the available channels are generally receivable, it is desirable, especially in automatic and remote control tuners, to be able to by-pass the other channels. The by-pass, or programming adjustment involved should be easily accomplished by the average viewer to accommodate various reception areas and differing viewer choice. The adjustment mechanism should be simple, compact, and reliable.

Accordingly, it is an object of this invention to provide an accurate, reliable, and easily adjustable fine tuning assembly that will automatically return the variable impedance of the fine tuning circuitry to a pre-set individual value for each channel as that channel is selected by the viewer.

It is a further object of this invention to provide a simple, economical pre-set fine tuning arrangement for use with an automatic, motor-driven channel selector unit, with or without remote control channel selection.

Another object of this invention is to provide a novel means of programming an automatic channel selecting unit for a television receiver or the like.

Still another object of this invention is to provide a single adjustment means which can alternatively effect either an automatic channel selector programming adjustment or an accurate pre-set fine tuning adjustment.

It is a still further object of this invention to provide a programming and tuning arrangement of the present type with novel safety switch and vacation switch features.

It is an additional object of this invention to provide each of the above mentioned features in a television tuning unit having a channel selector shaft and a separate fine tuning and programming shaft laterally spaced apart from one another.

Other and further advantages and objects of the present invention will become apparent from examination of the detailed disclosure and drawings and from the claims.

A preferred embodiment of this invention is illustrated by the accompanying drawings in which:

2

Figures 3, 4, 5, 6:
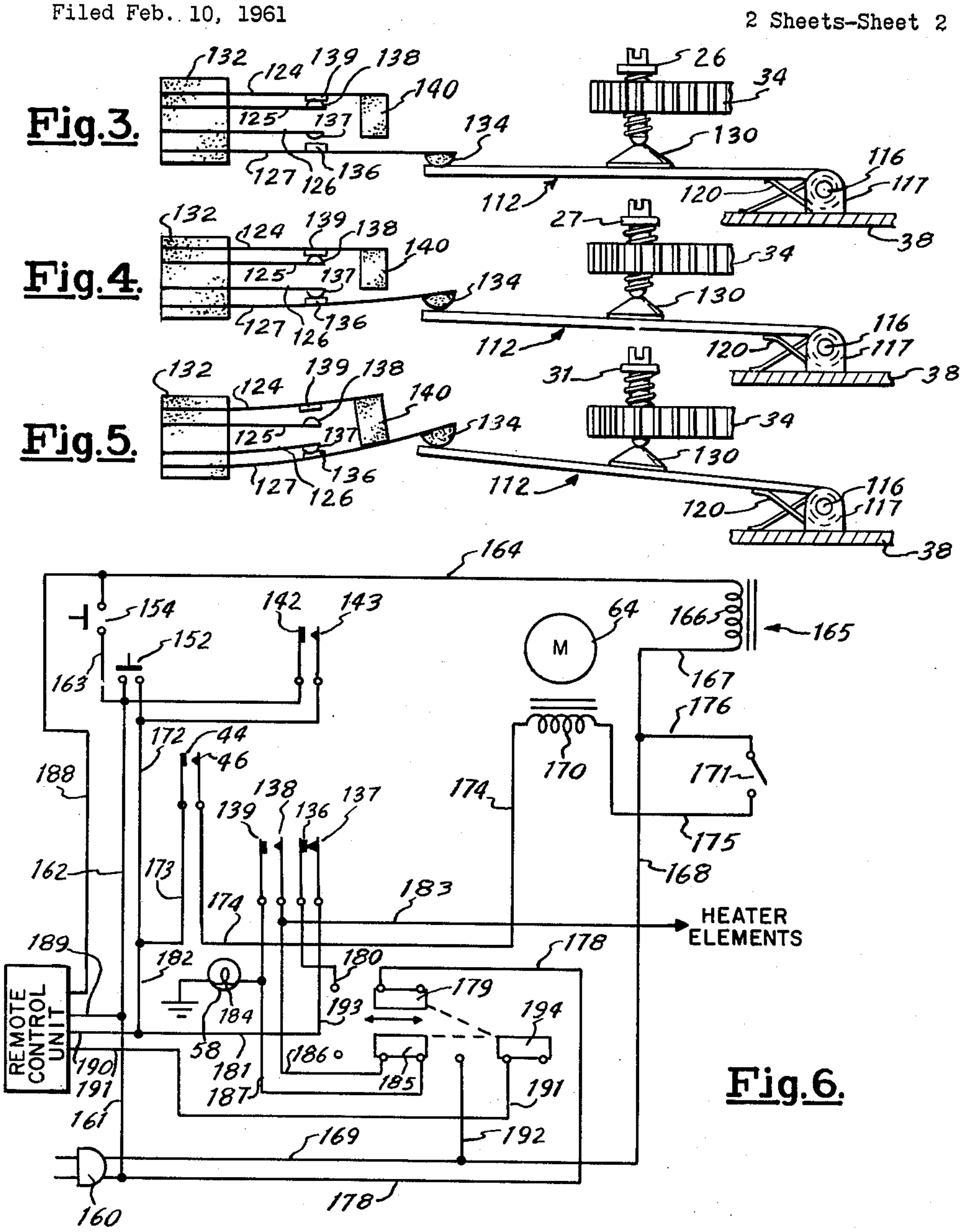

FIGURES 3, 4, and 5 disclose the interaction of the programming switch, the channel indicator light switch, the rocker arm and the fine tuning screw at each of three different settings of the screw.

FIGURE 6 is an electrical diagram showing the complete electrical interconnection of the elements of this embodiment.

Figure 7:
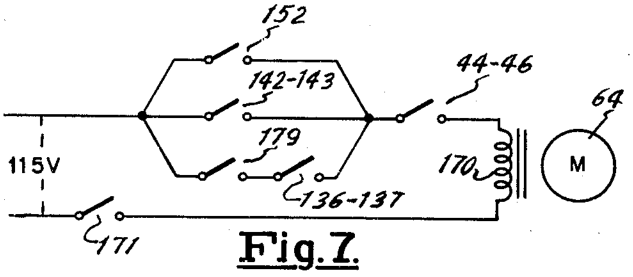

FIGURE 7 is a simplified electrical diagram of the circuit of FIG. 6.

Referring now to the drawings, in which like elements are designated by like reference numbers, the front plate 10 of a television receiver is provided with an opening 12 for receiving a fine tuning shaft 14. The fine tuning shaft 14 is provided with a knurled knob 16 on its exterior end to facilitate manual rotation of the shaft and a narrow screwdriver configuration 18 at its interior and adapted for engagement with a series of adjustment screws 26–32. A spur gear 34 is threaded to receive the screws 26–32 through its thickness at a given radial distance from its axis of rotation, adjacent screws being equally spaced apart on the gear face, and one screw being provided for each channel selection point of the television tuner. The gear 34 is rotationally mounted on a shaft 36 which extends inwardly from the front of a sheet metal housing 38. The housing 38, which encloses the gear 34 and the elements associated with the gear 34, is rectangular in form with its front portion parallel to the front plate 10. The fine tuning shaft 14 is received through a narrow clearance opening 40 in the front of the housing 38 to permit free axial movement of the shaft 14 in and out of engagement with the screws 26–32 and free rotational movement of the shaft 14 for adjusting the positions of screws 26–32. A disk 20 of insulating material is fixed around the shaft 14 outside of housing 38, and a helical compression spring 24, loosely circumscribing the shaft 14, acts between the disk 20 and the housing 38 to urge the screwdriver end 18 out of engagement with the screws 26–32. A second disk 22 is fixed around the shaft 14 inside of housing 38 to limit the outward movement of the fine tuning shaft 14 by acting as a stop against the front inner surface of housing 38.

A second spur gear 48 meshes with gear 34 and is affixed to the channel selector shaft 50, which is rotatably received by the front of the housing 38 above shaft 36 and which terminates just back of the front plate 10 in a channel indicator disk 52. Indicator disk 52 is provided with a series of translucent windows 54 disposed along its periphery, each window containing a number. These numbers appear sequentially opposite a window 56 in the front plate 10 as the channel selector shaft 50 is rotated. A small incandescent lamp 58 is provided in back of disk 52 and in line with windows 54 and 56 to illuminate the numbers on window 54 and project their images on the front plate window 56 as they appear in front of the lamp 58.

A second rectangular sheet metal housing 60 is affixed to the rear of housing 38 for enclosing the tuning circuit components and the channel selector turret assembly 62. Mounted on the back of housing 60 is a motor 64 for rotating the channel selector shaft 50. The turret 62 comprises two spaced apart mounting disks 66 and 68 affixed to the shaft 50 and a series of channel strips 70–75 which are mounted between the disks 66 and 68, and which are equally spaced apart along the peripheries of disks 66 and 68. Each channel strip (see FIG. 1, strip 70) comprises a support of plastic material and four coils 77–80 having carefully chosen inductive properties. The ends of each coil are connected to separate contacts 81–88 on the outer surface of the strip, and a contact block 89 is provided adjacent to turret 62 with eight spring contacts 90–97 for engaging corresponding ones of contacts 81–88. The corresponding contacts of the other strips 71–75 are engaged by the spring contacts 90–97 as each strip in turn is rotated into position. Each pair of spring contacts 90–91, 92–93, 94–95, and 96–97 is connected into a different section of the tuner circuitry so that section will be properly tuned to the corresponding channel. The antenna, amplifier, mixer, and oscillator sections must each be tuned as the channel is changed, and the strip coils provide the variable inductances that accomplish this tuning.

However, it is desirable to provide additional fine tuning for the oscillator section that is readily adjustable by the user of the receiver to periodically correct for variations in tube constants and other circuit parameters which are likely to occur with age. So, a variable impedance element 100 is provided in the oscillator section comprising a fixed coil 101 and a core element 102 axially movable within the coil 101 by a thin rod 103 attached between the core element 102 and one end of a lever 104. The lever 104 is mounted centrally on a pivot pin 105 which is fastened by means of a bracket 106 to the outside rear wall of housing 38. The other end of the lever 104 bears against the back of a cylindrical sleeve 108 which is slidably mounted on the channel selector shaft 50. The lever 104 is biased about pivot pin 105 by a torsion spring 107 so that the other end of lever 104 bears, with a counter clockwise bias, against the sleeve 108. The sleeve 108 is received through a narrow clearance opening in the rear wall of housing 38 and its front face bears against a portion 110 of a rocker arm 112.

Figures 1, 2:
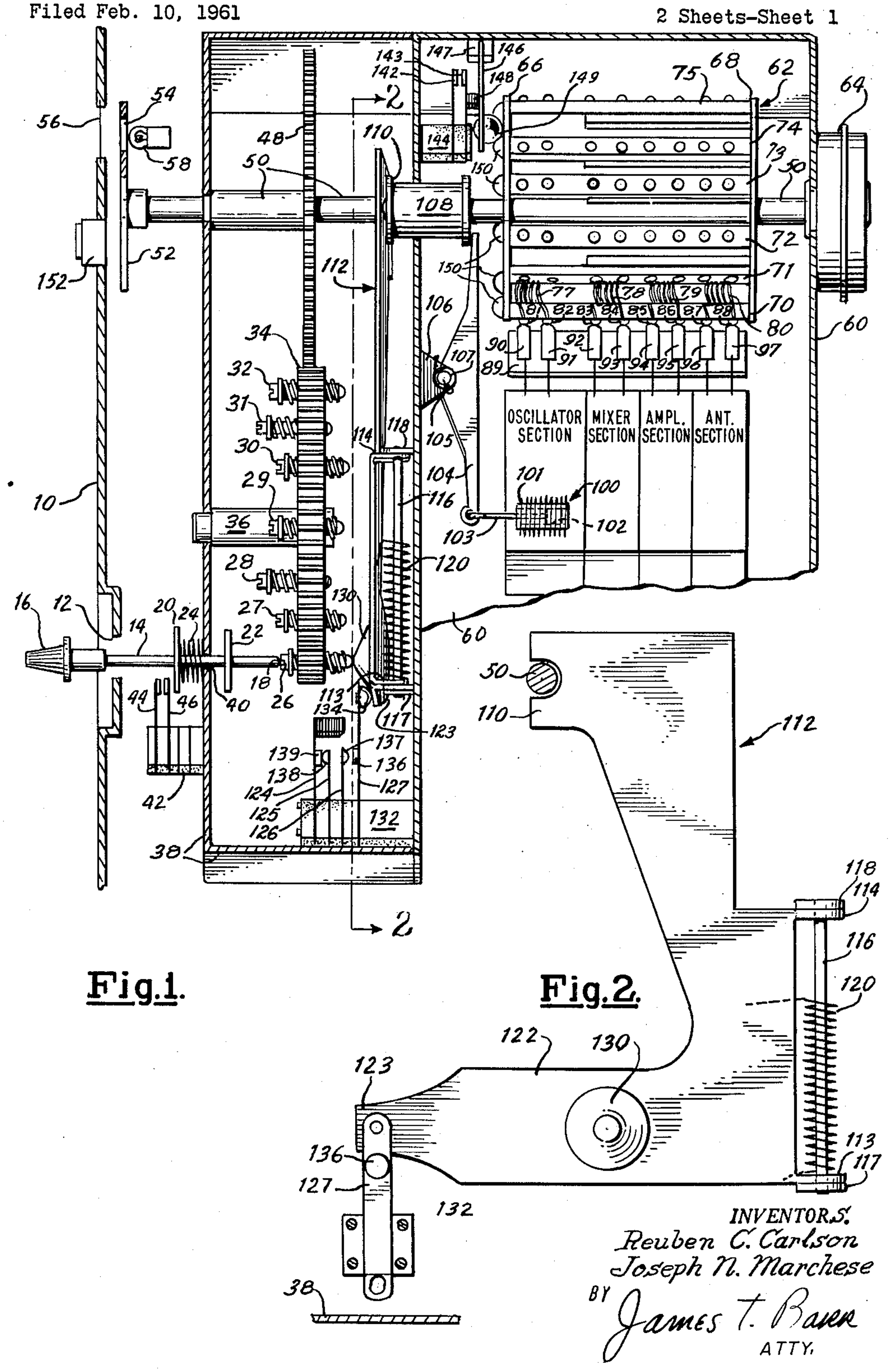
FIGURE 1 is a side elevation, partially in section, illustrating the fine tuning and channel selection mechanisms of a television receiver.
FIGURE 2 is taken along section 2—2 of FIGURE 1 to show the rocker arm of the present invention in conjunction with a programming switch.

The rocker arm 112, best shown in FIGURE 2, is pivotally mounted at two small flanges 113 and 114 on a substantially vertical shaft 116. The shaft 116 is affixed to the inside surface of the rear wall of housing 38 through two small flanges 117 and 118, and it supports a helical torsion spring 120 that acts between the rear wall of housing 38 and the rocker arm 112 to bias the rocker arm away from the housing. The rocker arm 112 generally comprises two coplanar extended portions, an offset portion 110 extending upwards and to the left from the shaft 116 and a straight portion 122 extending to the left from shaft 116 and terminating in a narrowed portion 123 that operates a group of leaf switch elements 124–127. A plastic knob 130 of flattened pyramidal configuration is affixed to the front of the straight portion 122 about half way between the shaft 116 and the end of portion 122, and the rocker arm 112 is mounted so that the knob 130 is in line with the fine tuning shaft 14. Thus, the knob 130 bears against the lead end of the screw (26 in FIG. 1) that is aligned with the shaft 14 for a given channel selector position. The pivotal position of the rocker arm 112 for any channel position is determined by the depth of protrusion from spur gear 34 of the screw corresponding to that channel position.

The leaf switch elements 124–127 are mounted on the inside surface of the rear wall of housing 38 through a stack of insulators 132 so that an insulating knob 134 on leaf 127 engages the narrowed portion 123 of rocker arm 112. Midway between the knob end and the stack end of leaf 127 is a contact 136 that is opposite a similar contact 137 on the next leaf 126. When the screw 26 is backed off far enough contacts 136–137 are closed. Switch leaf elements 125 and 124 have similarly opposed contacts 138 and 139 respectively that are normally closed. However an insulating block 140 on the back of leaf 124 is engageable with leaf 127 upon further backing-off of screw 26 to open contacts 138–139. As discussed hereinafter, contacts 136–137 control the channel selector programming while contact 138–139 control the channel indicator lamp.

A pair of detent-operated contacts 142–143 associated with the tuner turret 62 are mounted as shown on the rear wall of housing 38 through a stack of insulators 144. A stiff flat spring 146 is mounted to the inside top wall of housing 60 through a mounting 147, and extends downwardly in juxtaposed relationship to mounting disk 66. The spring 146 has a hole in its lower end for receiving a ball detent 149. Spring 146 resiliently urges the ball 149 against the front of disk 66. Disk 66 has a series of rounded protrusions 150, one for each pair of adjacent channel positions, that pass sequentially opposite ball 149 as the channel selector turret is rotated, thereby forcing the ball 149 and spring 146 forward. An insulating block 148 is mounted as shown for engagement with spring 146 and operation of contacts 142–143. Thus the normally open switch contacts 142–143 are closed as the ball 149 rides up on a protrusion 150. When the motor 64 is de-energized, spring 146 is strong enough to act through ball 149 to positively position the turret 62 in the nearest one of its thirteen channel positions, wherein the contacts 81–88 of a particular strip 70–75 are connected to the contacts 90–97.

A safety switch, having a pair of contact bearing leaf springs 44 and 46, is mounted between front plate 10 and housing 38 through an insulator stack 42 for cooperation with the disk 20 on fine tuning shaft 14. In the normal "out" position of the fine tuning shaft 14, disk 20, through the action of spring 24, forces the contact on spring leaf 46 into engagement with the contact on spring leaf 44 thus closing the safety switch. When shaft 14 is forced inwardly to adjust the fine tuning of a channel, the safety switch is opened.

In addition, a momentary contact "on-off" switch 154 operable in conjunction with the volume control (not shown) is provided to control the energizing circuitry (see FIG. 6) of the motor 64, and a momentary contact automatic channel selector switch 152 is provided on the receiver front to permit manual operation of the channel selector. A "vacation" switch 179 (see FIG. 6), not shown in FIG. 1, is provided to vacate the programming established by the screw settings and permit relocation of programmed-out channels.

Provision for remote control by predetermined ultrasonic frequency signals is contemplated by this invention, but the microphone, amplifier, and discriminator means commonly utilized in remote control receivers of this type are not herein disclosed in detail. A full description of remote control circuitry useable with the present invention can be found in the co-pending application of Reuben C. Carlson et al., Serial No. 36,223, "Electro-Mechanical Remote Control System," filed June 15, 1960.

Now referring more specifically to the circuitry of FIG. 6, a plug 160 is provided to supply 115 volt, 60 cycle A.C. current from an ordinary home outlet. This 115 volts may be applied across a motor coil 170 to energize the motor 64 through any of a variety of circuit paths.

First, under direct control, when the momentary contact "on-off" switch 154 is closed, the stepping relay 165 is energized from the 115 volt source over leads 161, 162, 163, switch 154, lead 164, relay coil 166, leads 167, 168 and 169. The stepping relay 165 closes a cam switch 171 that remains closed until a subsequent operation of "on-off" switch 154. Then, when the momentary contact channel selector switch 152 is closed, the motor 64 is energized from the 115 volt source over leads 161, 162, switch 152, leads 172, 173, safety switch contacts 44 and 46, lead 174, motor coil 170, lead 175, cam switch 171, and leads 176, 168 and 169. The motor 64, now energized, begins to turn the turner turret 62, thereby causing the ball detent 49 to ride up on a protrusion 150 and close the detent switch contacts 142–143. Detent switch contacts 142–143 are connected across the terminals of channel selector switch 152, so the motor 64 remains energized while switch contacts 142–143 are closed even after selector switch 152 opens.

Next, as the ball detent 49 rides down the other side of the protrusion 150, spring 146 and insulating block 148 allow switch contacts 142–143 to open and the motor 64 is de-energized. However, if the corresponding one of screws 26–32 has been backed off far enough to allow rocker arm 112 to close program switch contacts 136–137 (see FIGS. 4 and 5), a third circuit path to motor coil 170 is provided as follows: lead 178, closed vacation switch 179 (shown in open position in FIG. 6), lead 180, program switch contacts 136–137, leads 193, 181, 182, 173, safety switch contacts 44 and 46, lead 174, motor coil 170, lead 175, cam switch 171, and leads 176, 169. Thus any of the screws 26–32 corresponding to respective individual channels may be pre-set to allow motor 64 to drive the tuner turret 62 past that individual channel position to the next one without stopping.

The channel indicator lamp 58 is normally lit while the television receiver is on. The lamp is energized by about six volts A.C. received via lead 183 from the vacuum tube heater element circuit of the receiver through the normally closed switch contacts 138–139. However, if one of the screws 26–32 is backed off far enough to open switch contacts 138–139 (see FIG. 5), the lamp 58 will not be lit in that channel position. A lamp restoring switch 185 is mounted to be movable with the vacation switch 179 and is closed when the vacation switch 179 is open and vice versa. Normally open switch contacts 185 is connected in parallel with switch 138–139 through leads 186 and 187.

As an alternative to direct control from on-off switch 154 and channel selector switch 152 as described above, the channel selector may be remotely controlled from a remote control unit such as that disclosed in the application of Carlson et al. referred to above. Briefly, leads 188 and 189 of FIGURE 6 are connectable through a remotely controlled switching element in parallel with on-off switch 154, which switching element is momentarily actuatable by a remotely generated signal of predetermined characteristics. Leads 189 and 190 of FIGURE 6 are similarly connectable through a remotely controlled switching element in parallel with channel selector switch 152, which switching element is momentarily actuatable by a remotely generated signal having other predetermined characteristics. The remote control unit is powered from the 115 volt source over leads 169, 192, closed vacation switch 194, lead 191, lead 189, and lead 161. Disconnect switch 194 is mounted for movement with the vacation switch 179 and the channel indicator lamp restoring switch 185 and is closed when the vacation switch 179 is closed.

Thus, with the vacation switch 179 in its normally closed position, the cam switch 171 may be closed to turn the set on by momentarily closing switch 154 manually or by remotely placing a momentary shunt across switch 154 (by connecting leads 188 and 189 together). With cam switch 171 closed, rotation of the tuner turret 62 to a new channel position is initiated by momentarily closing the channel selector switch 152 manually or by remotely placing a momentary shunt across switch 152 (by connecting leads 189 and 190 together). As the tuner turret 62 arrives at each of its successive channel positions, the position of the fine tuning slug 102 is determined by the preset position of the one of the screws 26–32 corresponding to that channel position (through lever 112, sleeve 108 and lever 104). When the turret 62 reaches a programmed-out channel position, that is one in which the corresponding one of screws 26–32 has been backed out of gear 34 far enough to permit programming switch contacts 136–137 to close, the motor 64 will remain energized and continue to drive the turret 62 to the next successive channel position.

A channel may be programmed-out by backing off the corresponding one of adjustment screws 26–32 until indicator light 58 goes out. As may best be seen in FIGS. 3–5 contacts 138 and 139 are open only when program switch contacts 136–137 are closed. In performing this operation, the operating circuit for motor 64 is disabled by the safety switch. This is essential since, without the safety switch, motor 64 would be energized and tend to drive turret 62 whenever program contacts 136–137 were closed.

However, with the vacation switch 179 open, the programming switch is ineffectual and the tuner turret 62 will stop at each successive channel position with successive actuations of switch 152. In addition, the remote control unit will be powerless because switch 194 is open, and the lamp 58 will light at every channel position because switch 185 is closed. These features are important to permit restoration of a previously programmed-out channel. The vacation switch also provides a convenient method of disabling the remote control unit whenever the television receiver is to be left unattended for any substantial length of time. This effectively prevents any possible triggering of the remote control unit by spurious noise signals which might result in the receiver being turned on.

It will thus be seen that the objects set forth earlier in this disclosure are fully achieved in the embodiments of the invention described herein. Also, it is obvious that numerous modifications and alternative means not specifically mentioned herein could be employed without departing from the spirit and scope of this invention. It is not intended that the scope of the appended claims be limited by the omission of these modifications and substitutions from the disclosure.

Therefore, what is claimed is:

1. In combination; a tuner having a plurality of station tuning positions; a motor drivingly coupled to said tuner; a source of power for said motor; momentary contact switch means connected in circuit with said motor and said source; mechanical detent means urging said tuner into said station tuning positions; a first switch connected in parallel with said momentary contact switch means; a second switch connected in series with the parallel combination of said momentary contact switch means and said first switch; said first switch being normally closed between adjacent station tuning positions and said second switch being normally closed for all positions of said tuner; a common fine tuning circuit, including a variable impedance coupled to said tuner; a movable element varying the value of said variable impedance; means drivingly coupled to said tuner; carrying a plurality of adjustment elements; each of said plurality of adjustment elements corresponding to a respective one of said plurality of station tuning positions and each having first and second adjustment ranges; means sequentially coupling different ones of said plurality of adjustment elements to said movable element and to said first switch, said first switch being opened by said adjustment elements set in said first adjustment range to thereby deenergize said motor and stop said tuner in corresponding ones of said plurality of station tuning positions; said adjustment elements in said second adjustment range maintaining said first switch closed and preventing deenergization of said motor; manually operable means for adjusting said adjustable elements, said second switch being opened only during operation of said manually operable means; and visual means indicating which station tuning position said tuner is in; a third switch controlling energization of said visual means; said third switch being sequentially coupled to said adjustment element to deenergize said visual means only when said adjustment elements are in said second adjustment range.

2. The combination of claim 1 further including a fourth manually operated switch connected in series with said first switch; said tuner being sequentially driven and stoping in successive station tuning positions for each operation of said momentary contact switch means when said fourth switch is in its open position irrespective of the settings of said adjustment elements.

References Cited by the Examiner

UNITED STATES PATENTS

| | | | |
|---|---|---|---|
| 2,805,379 | 9/57 | Troellen et al. | 250—40.21 |
| 2,812,486 | 11/57 | Foster | 318—467 |
| 2,830,182 | 4/58 | Thias | 334—51 |
| 2,839,936 | 6/58 | Dawson | 250—40 |
| 2,863,058 | 12/58 | Thias | 74—10.41 |
| 2,920,198 | 1/60 | Parmet et al. | 250—40 |
| 2,956,161 | 10/60 | Cady | 318—467 X |
| 2,965,829 | 12/60 | Lingenbrink et al. | 250—40.1 |
| 2,975,276 | 3/61 | Thias | 250—40.775 |
| 2,981,838 | 4/61 | Poskozim | 250—40 |
| 3,022,674 | 2/62 | Cross et al. | 14—10.6 |

HERMAN KARL SAALBACH, *Primary Examiner.*

SAMUEL B. PRITCHARD, *Examiner.*